US010176853B2

(12) United States Patent
Hong et al.

(10) Patent No.: US 10,176,853 B2
(45) Date of Patent: Jan. 8, 2019

(54) PRE-PROCESSING CIRCUIT WITH DATA-LINE DC IMMUNE CLAMPING AND ASSOCIATED METHOD AND SENSING CIRCUIT

(71) Applicant: MEDIATEK INC., Hsin-Chu (TW)

(72) Inventors: Chi-Hao Hong, Changhua County (TW); Dao-Ping Wang, Hsinchu (TW); Yi-Wei Chen, Yilan County (TW); Yi-Ping Kuo, Hsinchu (TW); Shu-Lin Lai, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/499,876

(22) Filed: Apr. 27, 2017

(65) Prior Publication Data

US 2017/0345469 A1    Nov. 30, 2017

Related U.S. Application Data

(60) Provisional application No. 62/341,613, filed on May 25, 2016.

(51) Int. Cl.
*G11C 7/12* (2006.01)
*G11C 7/06* (2006.01)
(Continued)

(52) U.S. Cl.
CPC .............. *G11C 7/12* (2013.01); *G11C 7/06* (2013.01); *G11C 7/065* (2013.01); *G11C 7/08* (2013.01); *G11C 7/109* (2013.01)

(58) Field of Classification Search
CPC ...................................................... G11C 7/12
(Continued)

(56) References Cited

U.S. PATENT DOCUMENTS 5,608,681 A    3/1997 Priebe
6,512,689 B1 *  1/2003 Naji .................... G11C 7/14
                                                365/158

(Continued)

FOREIGN PATENT DOCUMENTS

TW        201506940 A    2/2015

OTHER PUBLICATIONS

Arsovski, Self-referenced sense amplifier for across-chip-variation immune sensing in high-performance Content-Addressable Memories, pp. 453-456, IEEE 2006 Custom Intergrated Circuits Conference (CICC).

*Primary Examiner* — Min Huang
(74) *Attorney, Agent, or Firm* — Winston Hsu

(57) ABSTRACT

A pre-processing circuit is used for pre-processing a data-line voltage representative of a data output of a memory device. The pre-processing circuit includes a pre-charging circuit and a clamping circuit. The pre-charging circuit pre-charges a data line to adjust the data-line voltage at the data line that is coupled to the memory device. The clamping circuit clamps the data-line voltage to generate a clamped data-line voltage when the data-line voltage is pre-charged to a level that enables a clamping function of the clamping circuit, wherein the clamped data-line voltage is lower than a supply voltage of the pre-processing circuit. The clamping circuit includes a feedback circuit that feeds back a control voltage according to the data-line voltage at the data line, and further reduces its direct current (DC) leakage when the data-line voltage is clamped, wherein the clamping function of the clamping circuit is controlled by the control voltage.

12 Claims, 5 Drawing Sheets

(51) Int. Cl.
*G11C 7/10* (2006.01)
*G11C 7/08* (2006.01)

(58) Field of Classification Search
USPC .................................................... 365/189.06
See application file for complete search history.

(56) References Cited

U.S. PATENT DOCUMENTS

| | | | | |
|---|---|---|---|---|
| 6,756,823 | B1* | 6/2004 | Chen | H03K 3/356121 |
| | | | | 327/52 |
| 8,687,398 | B2* | 4/2014 | Chang | G11C 15/00 |
| | | | | 365/49.15 |
| 8,861,264 | B2 | 10/2014 | Song | |
| 2008/0049528 | A1* | 2/2008 | Yang | G11C 7/02 |
| | | | | 365/205 |
| 2009/0086534 | A1* | 4/2009 | DeBrosse | G11C 7/062 |
| | | | | 365/163 |
| 2014/0092671 | A1* | 4/2014 | Azuma | G11C 13/004 |
| | | | | 365/148 |
| 2016/0254059 | A1* | 9/2016 | Ochi | G11C 16/26 |
| | | | | 365/185.22 |

* cited by examiner

PRE-PROCESSING CIRCUIT WITH DATA-LINE DC IMMUNE CLAMPING AND ASSOCIATED METHOD AND SENSING CIRCUIT

CROSS REFERENCE TO RELATED APPLICATIONS

This application claims the benefit of U.S. provisional application No. 62/341,613, filed on May 25, 2016 and incorporated herein by reference.

BACKGROUND

The present invention relates to a data sensing scheme of a memory device, and more particularly, to a pre-processing circuit with data-line direct current (DC) immune clamping and associated method and sensing circuit.

Typically, a sensing circuit is used to read data from a memory cell of a memory array. The sensing circuit is capable of sensing a low voltage signal representative of a data bit stored in the memory cell, and amplifying the low voltage signal to a high voltage signal for further processing. A sensing circuit's power consumption should be as low as possible in order to achieve targets for ultra-low power applications. Hence, there is a need for an innovative low power sensing scheme that can be applied to a variety of memory devices.

SUMMARY

One of the objectives of the claimed invention is to provide a pre-processing circuit with data-line direct current (DC) immune clamping and associated method and sensing circuit.

According to a first aspect of the present invention, an exemplary pre-processing circuit for pre-processing a data-line voltage representative of a data output of a memory device is disclosed. The exemplary pre-processing circuit includes a pre-charging circuit and a clamping circuit. The pre-charging circuit is arranged to pre-charge a data line to adjust the data-line voltage at the data line, wherein the data line is coupled to the memory device. The clamping circuit is arranged to clamp the data-line voltage to generate a clamped data-line voltage when the data-line voltage is pre-charged to a level that enables a clamping function of the clamping circuit, wherein the clamped data-line voltage is lower than a supply voltage of the pre-processing circuit. The clamping circuit comprises a feedback circuit arranged to feedback a control voltage according to the data-line voltage at the data line, and further arranged to reduce its direct current (DC) leakage when the data-line voltage is clamped, wherein the clamping function of the clamping circuit is controlled by the control voltage.

According to a second aspect of the present invention, an exemplary method for pre-processing a data-line voltage representative of a data output of a memory device is disclosed. The exemplary method includes: pre-charging a data line to adjust the data-line voltage at the data line, wherein the data line is coupled to the memory device; feeding back, by a feedback circuit, a control voltage according to the data-line voltage at the data line, wherein a clamping function is controlled by the control voltage; when the data-line voltage is pre-charged to a level that enables the clamping function, clamping the data-line voltage to generate a clamped data-line voltage, wherein the clamped data-line voltage is lower than a supply voltage; and when the data-line voltage is clamped, controlling the feedback circuit to reduce its direct current (DC) leakage.

According to a third aspect of the present invention, an exemplary sensing circuit for generating a sensing output according to a data-line voltage representative of a data output of a memory device is disclosed. The exemplary sensing circuit includes a pre-processing circuit and an asymmetrical sense amplifier. The pre-processing circuit is arranged to clamp the data-line voltage at a data line to generate a clamped data-line voltage, wherein the data line is coupled to the memory device, and the clamped data-line voltage is lower than a supply voltage of the pre-processing circuit. The asymmetrical sense amplifier is arranged to receive an input voltage developed at the data line after the clamped data-line voltage is generated, and amplify the input voltage to generate the sensing output.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
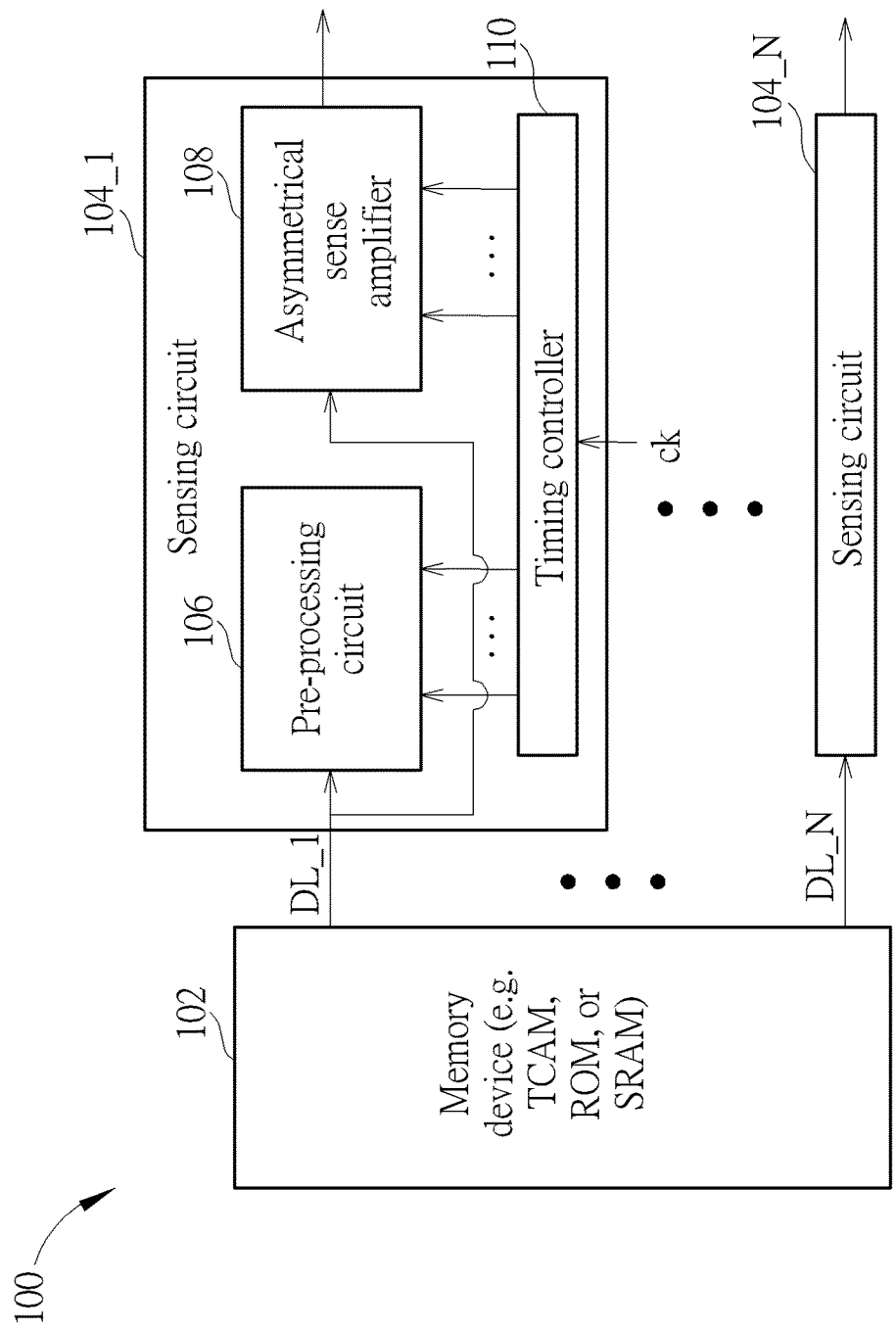
FIG. 1 is a block diagram illustrating a memory system according to an embodiment of the present invention.

FIG. 1 is a block diagram illustrating a memory system according to an embodiment of the present invention. The memory system 100 includes a memory device 102 and a plurality of sensing circuits 104_1-104_N. The memory device 102 may be a memory array composed of a plurality of memory cells. For example, the memory device 102 may be a content-addressable memory (CAM) such as a ternary content-addressable memory (TCAM), a read-only memory (ROM), or a static random access memory (SRAM) such as a 8T (8 transistor) 2-Port SRAM. As shown in FIG. 1, the sensing circuits 104_1-104_N are coupled to the memory device 102 via data lines DL_1-DL_N, respectively. In a case where the memory device 102 is a TCAM, data lines DL_1-DL_N are coupled to match lines of the TCAM, respectively. In another case where the memory device 102 is a ROM/SRAM, data lines DL_1-DL_N are coupled to bit lines of the ROM/SRAM, respectively. Hence, a data-line voltage at each of the data lines DL_1-DL_N represents a data output of a corresponding match line/bit line.

Each of the sensing circuits 104_1-104_N may be configured to have the same circuit architecture. Taking the sensing circuit 104_1 for example, it includes a pre-processing circuit 106, an asymmetrical sense amplifier 108 and a timing controller 110. The timing controller 110 is arranged to generate control signals to the pre-processing circuit 106 and the asymmetrical sense amplifier 108 according to a reference clock ck, where operations of the pre-processing circuit 106 and the asymmetrical sense amplifier 108 are controlled/triggered by the control signals. Any circuit design capable of generating the required control signals may be employed to realize the timing controller 110. The sensing circuit 104_1 is used for generating a sensing output according to a data-line voltage at the corresponding data line DL_1, where the data-line voltage at the data line DL_1 is representative of a data output of a corresponding match line/bit line of the memory device 102. In this embodiment, the pre-processing circuit 106 is arranged to clamp the data-line voltage at the data line DL_1 to generate a clamped data-line voltage, where the clamped data-line voltage is lower than a supply voltage of the pre-processing circuit 106. In other words, an input voltage of the asymmetrical sense amplifier 108 is ensured to have a low voltage swing. Hence, the asymmetrical sense amplifier 108 may be an asymmetrical low voltage swing sense amplifier capable of dealing with the input voltage with a low voltage swing. In this embodiment, the asymmetrical sense amplifier 108 is arranged to receive the input voltage developed at the data line DL_1 after the clamped data-line voltage is generated by the preceding pre-processing circuit 106, and amplify the input voltage to generate the sensing output, where the sensing output may have a large voltage swing that can be correctly processed by a following processing circuit (not shown). Further details of the pre-processing circuit 106 and the asymmetrical sense amplifier 108 are provided as below.

Figure 2:
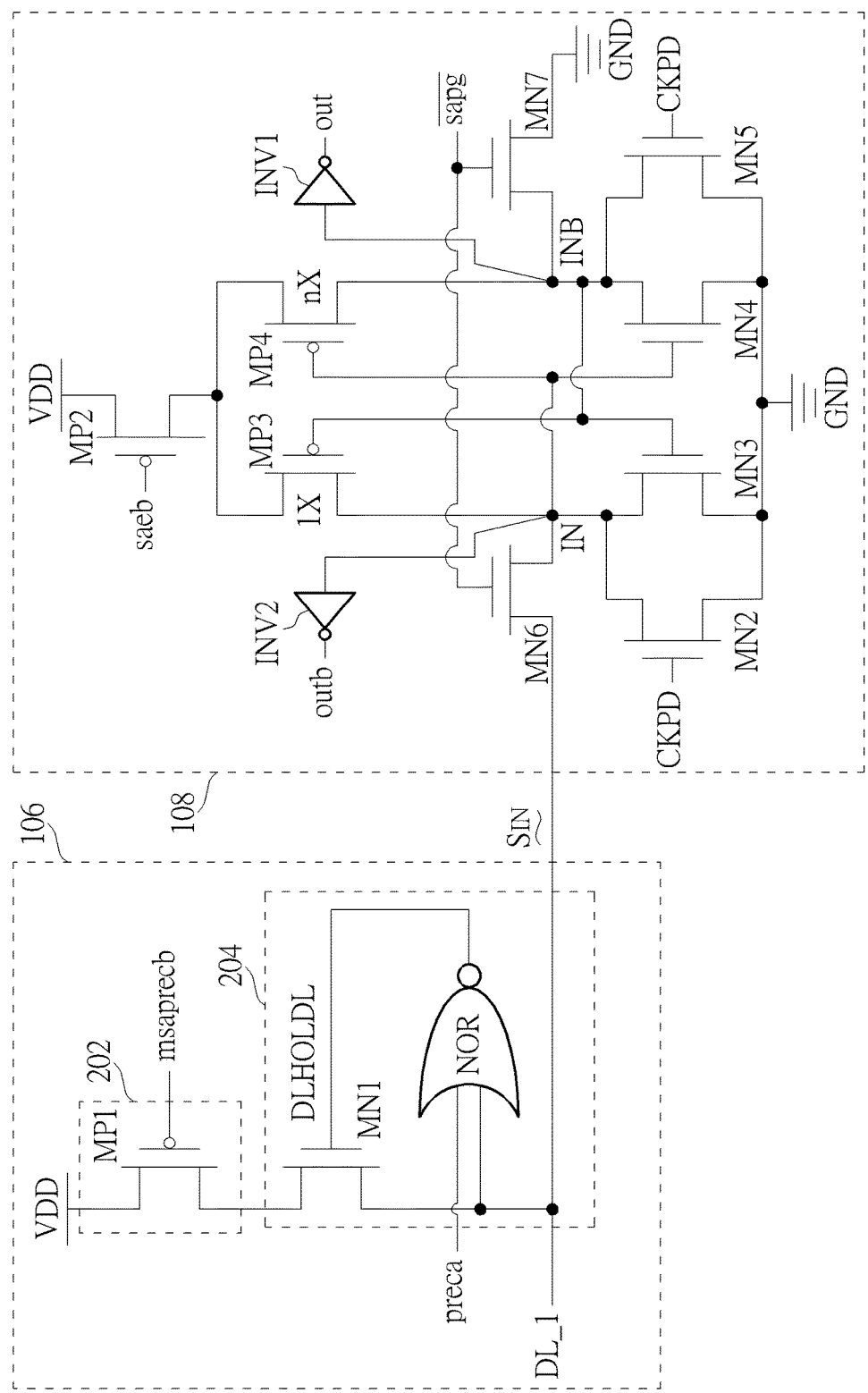
FIG. 2 is a diagram illustrating one circuit design of a pre-processing circuit and an asymmetrical sense amplifier shown in FIG. 1 according to an embodiment of the present invention.

FIG. 2 is a diagram illustrating one circuit design of the pre-processing circuit 106 and the asymmetrical sense amplifier 108 shown in FIG. 1 according to an embodiment of the present invention. As shown in FIG. 2, the asymmetrical sense amplifier 108 includes a plurality of transistors MP2, MP3, MP4, MN2, MN3, MN4, MN5, MN6, MN7 and a plurality of inverters INV1, INV2. In this embodiment, the transistors MP2, MP3, MP4 may be P-channel metal oxide semiconductor (PMOS) transistors, and the transistors MN2, MN3, MN4, MN5, MN6, MN7 may be N-channel metal oxide semiconductor (NMOS) transistors. In addition, the transistors MP3 and MP4 have different sizes (aspect ratios), where the size (aspect ratio) of the transistor MP3 may be represented by 1X, the size (aspect ratio) of the transistor MP4 may be represented by nX, and n>1. An operation of the asymmetrical sense amplifier 108 is controlled by a plurality of control signals saeb, $\overline{sapg}$ (i.e., an inverted version of sapg) and CKPD generated from the timing controller 110 shown in FIG. 1.

Figure 3:
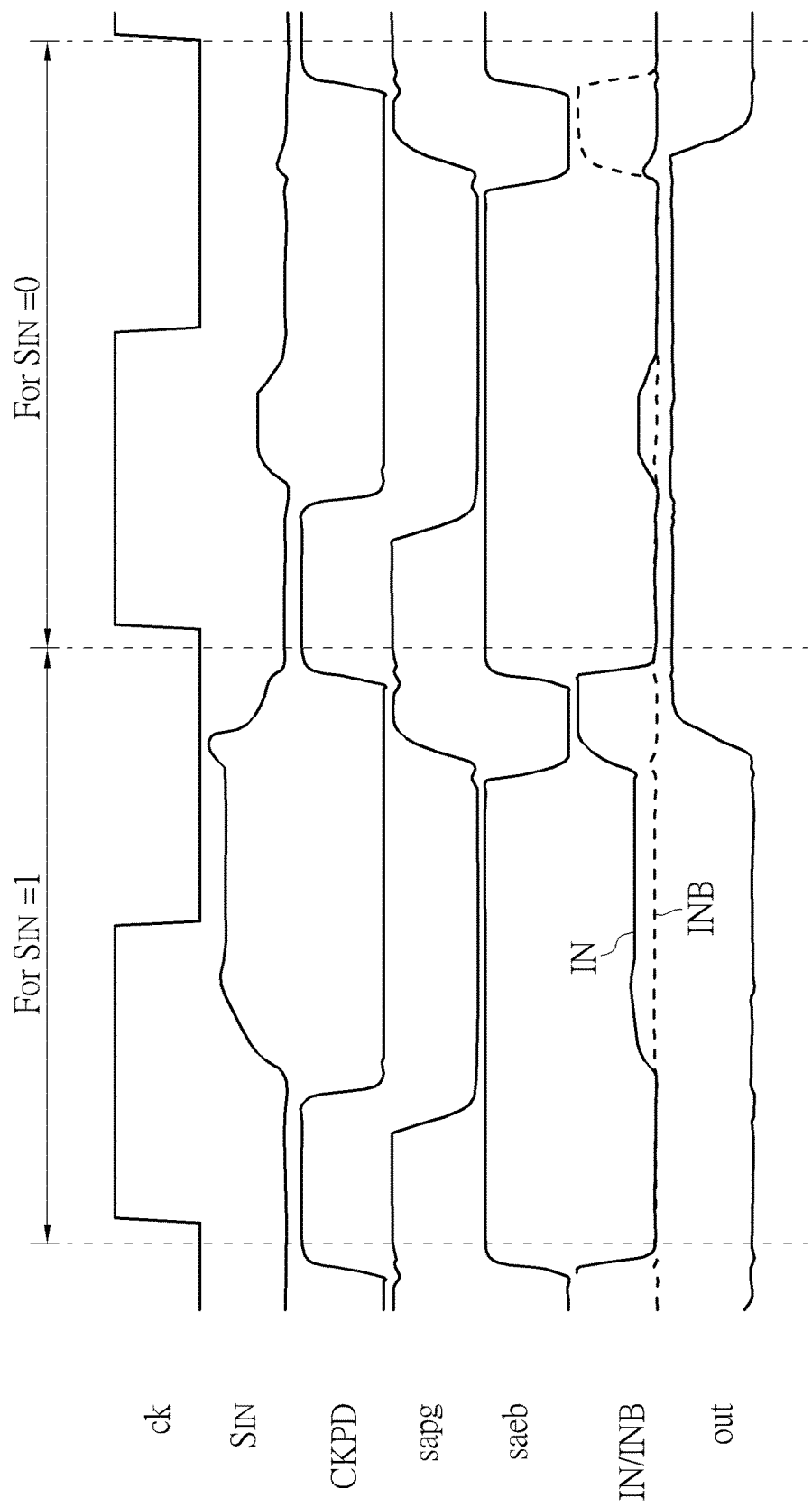
FIG. 3 is a timing diagram illustrating signals involved in the data sensing performed by the asymmetrical sense amplifier according to an embodiment of the present invention.

Please refer to FIG. 3 in conjunction with FIG. 2. FIG. 3 is a timing diagram illustrating a clock signal (denoted by "ck"), an input voltage (denoted by "$S_{IN}$") at the data line DL_1, control signals (denoted by "saeb", "sapg", "CKPD"), voltages at intermediate nodes IN and INB, and a sensing output (denoted by "out"). Initially, the control signal CKPD is set by a logic high level (e.g., VDD), the control signal sapg is set by a logic high level (e.g., VDD) (i.e., the control signal $\overline{sapg}$ is set by a logic low level (e.g., GND)), and the control signal saeb is set by a logic high level (e.g., VDD). Since the control signal CKPD is set by the logic high level, transistors MN2 and MN5 are turned on for resetting the voltages at intermediate nodes IN and INB to a ground voltage GND. Since the control signals saeb and sapg are set to have the logic high level, the transistors MP2, MN6 and MN7 are turned off. At this moment, the transistors MN3 and MN4 are also turned off due to the fact that voltages at intermediate nodes IN and INB are reset to the ground voltage GND.

Next, the control signal CKPD is set by a logic low level (e.g., GND) to turn off the transistors MN2 and MN5, the control signal sapg is set by a logic low level (e.g., GND) (i.e., the control signal $\overline{sapg}$ is set by a logic high level (e.g., VDD)) to turn on the transistors MN6 and MN7 for coupling the input voltage $S_{IN}$ developed at the data line DL_1 to the intermediate node IN and coupling the ground voltage GND to the intermediate node INB, respectively. Concerning the control signal saeb, it is kept at the logic high level, such that the transistor MP2 is not turned on at this moment.

Next, the control signal saeb is set to have a logic low level (e.g., GND) to turn on the transistor MP2. Hence, the asymmetrical sense amplifier 108 enters a sensing phase to generate the sensing output out. More specifically, the asymmetrical sense amplifier 108 sets the sensing output out in response to the input voltage $S_{IN}$ that is developed at the time the asymmetrical sense amplifier 108 enters the sensing phase. It should be noted that the control signal CKPD is kept at the logic low level, and the control signal sapg is set to have the logic high level (i.e., the control signal $\overline{sapg}$ is set to have the logic low level). Hence, the transistors MN2 and MN5 are not turned on, and the transistors MN6 and MN7 are turned off. In this way, the transistors MP3, MP4, MN3 and MN4 are arranged in a cross-coupled configuration. The ratio between transistors MP3 and MP4 is n, where the value of n can be adjusted according to the input voltage range. Specifically, the value of n defines an offset. When a voltage difference between the voltage level at the intermediate node IN (i.e., the input voltage $V_{IN}$ developed at the data line DL_1) and the level at the intermediate node INB (i.e., ground voltage GND) is larger than the offset, the voltage level at intermediate node IN is driven to a high voltage level via the supply voltage VDD and the transistor MP3, and the voltage level at intermediate node INB is kept at a low voltage level via the ground voltage VDD and the transistor MN4.

However, when the voltage difference between the voltage level at the intermediate node IN (i.e., the input voltage $V_{IN}$ developed at the data line DL_1) and the level at the intermediate node INB (i.e., ground voltage GND) is not larger than the offset, the voltage level at intermediate node IN is driven to a low voltage level via the ground voltage VDD and the transistor MN3, and the voltage level at node INB is driven to a high voltage level via the supply voltage VDD and the transistor MP4.

The inverter INV1 processes the voltage level at intermediate node INB to generate a sensing output out, while the inverter INV2 processes the voltage level at intermediate node IN to generate an inverted sensing output outb. Hence, when the single input (i.e., input voltage $S_{IN}$) at the data line DL_1 is developed for a data output "1" of a match line/bit line in the memory device 102, the sensing output out has a logic high level (e.g., VDD) to indicate that the data output "1" is sensed at the data line DL_1, and when the single input (i.e., input voltage $S_{IN}$) at the data line DL_1 is developed for a data output "0" of a match line/bit line in the memory device 102, the sensing output out has a logic low level (e.g., GND) to indicate that the data output "0" is sensed at the data line DL_1.

The input voltage $S_{IN}$ with a low voltage swing is sensed by the asymmetrical sense amplifier 108 to generate the sensing output with a high voltage swing. In this embodiment, the input voltage $S_{IN}$ with a low voltage swing is developed from a clamped data-line voltage (which is lower than the supply voltage VDD) provided by the preceding pre-processing circuit 106. More specifically, the use of the proposed pre-processing circuit 106 can ensure that the single input (i.e., input voltage $S_{IN}$) of the asymmetrical sense amplifier 108 has a low voltage swing.

Please refer to FIG. 2 again. In this embodiment, the pre-processing circuit 106 includes a pre-charging circuit 202 and a clamping circuit 204. The pre-charging circuit 202 includes a transistor MP1. The clamping circuit 204 includes a transistor MN1 and a feedback circuit, where the feedback circuit is implemented using a logic gate such as a NOR gate. In this embodiment, the transistor MP1 may be a P-channel metal oxide semiconductor (PMOS) transistor, and the transistor MN1 may be an N-channel metal oxide semiconductor (NMOS) transistor. As shown in FIG. 2, a control node of the transistor MP1 is arranged to receive a control signal msaprecb, a first connection node of the transistor MP1 is arranged to receive the supply voltage VDD, and a second connection node of the transistor MP1 is coupled to a first connection node of the transistor MN1, a second connection node of the transistor MN1 is coupled to the data line DL_1, and a control node of the transistor MN1 is arranged to receive a control voltage DLHOLDL fed back via the feedback circuit (e.g., NOR gate). An operation of the pre-processing circuit 106 is controlled by control signals msaprecb and preca generated from the timing controller 110 shown in FIG. 1.

As mentioned above, the data line DL_1 may be connected to a match line for a TCAM or may be connected to a bit line for a ROM/SRAM. When the match line/bit line is used to generate a data output "0", the match line/bit line may be connected to a discharge path. However, when the match line/bit line is used to generate a data output "1", the match line/bit line may be disconnected from the discharge path to have a high impedance state. Hence, when the data output is "1", the data line DL_1 is not coupled to the discharge path created in the memory device 102, and when the data output is "0", the data line DL_1 is coupled to the discharge path created in the memory device 102. The pre-processing circuit 106 is arranged to set the input voltage $S_{IN}$ that will be sensed by the following asymmetrical sense amplifier 108 during the sensing phase, where the input voltage $S_{IN}$ is developed from a clamped data-line voltage at the data line DL_1 according to a status of the match line/bit line.

Figure 4:
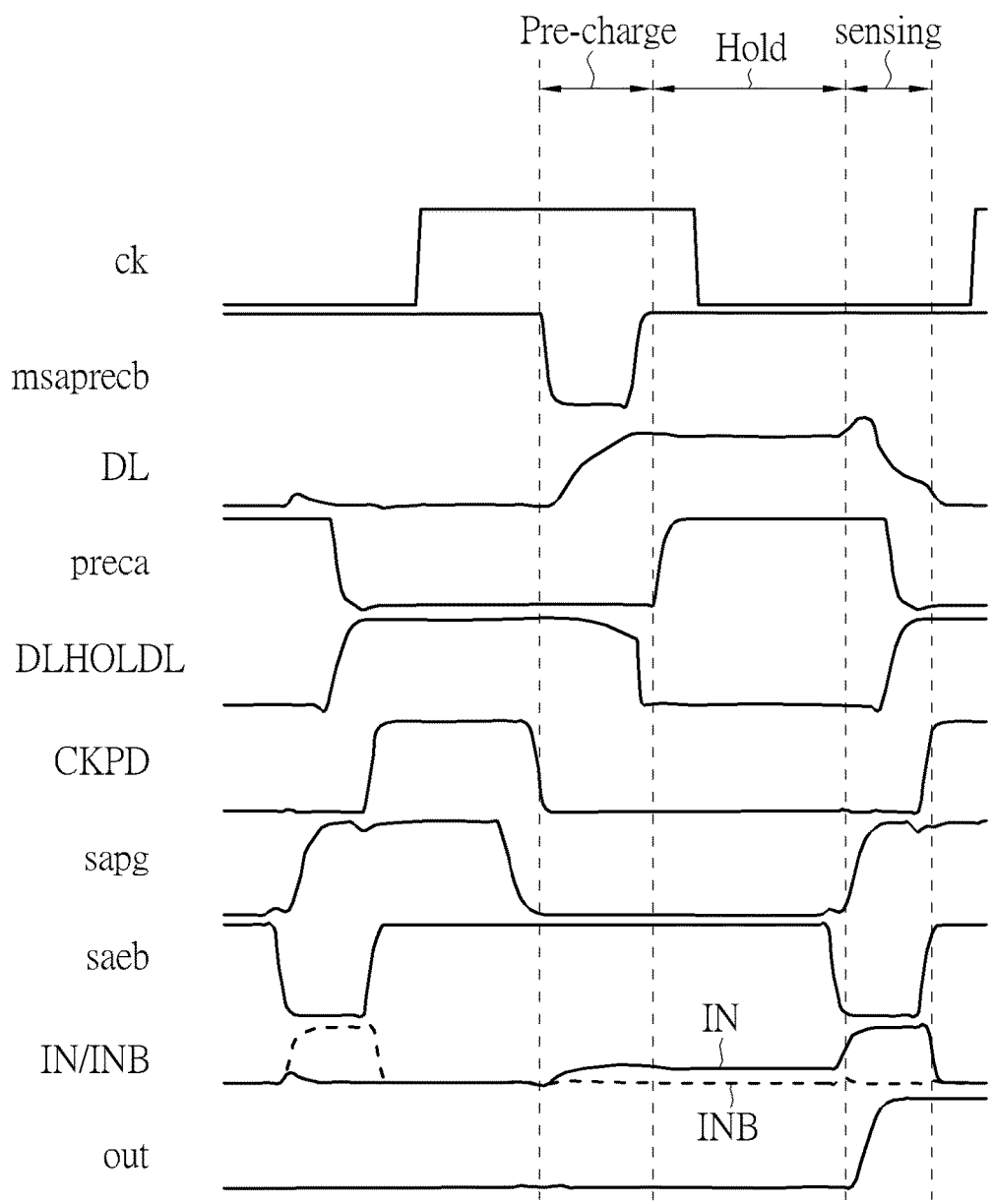
FIG. 4 is a timing diagram illustrating various signals associated with data sensing of a data output "1" according to an embodiment of the present invention.

Please refer to FIG. 2 in conjunction with FIG. 4. FIG. 4 is a timing diagram illustrating of a clock signal (denoted by "ck"), an input voltage (denoted by "$S_{IN}$") at the data line DL_1, control signals (denoted by "msaprecb", "preca", "saeb", "sapg", "CKPD"), voltages at intermediate nodes IN and INB, and a sensing output (denoted by "out") under a condition that the data output is "1". Before the pre-processing circuit 106 enters a pre-charge phase, the data line DL_1 is reset to a logic low level (e.g., GND). Hence, a default data output at the data line DL_1 is "0". In addition, the control signal msaprecb is set to have a logic high level (e.g., VDD) to turn off the transistor MP1, and the control signal preca is set to have a logic low level (e.g., GND) to make the DLHOLDL signal at an output node of the NOR gate have a logic high level (e.g., VDD).

Next, the control signal msaprecb is set to have a logic low level (e.g., GND), such that the pre-processing circuit 106 enters the pre-charge phase due to the turned-on transistor MP1. Hence, a pre-charge path is established between the supply voltage VDD and the data line DL_1 via the turned-on transistors MP1 and MN1. The data-line voltage at the data line DL_1 is gradually increased due to pre-charging. The NOR gate serves as a feedback circuit that is used to feed back a control voltage (i.e., DLHOLDL signal) according to the data-line voltage at the data line DL_1, where the control signal preca is kept at the logic low level during the pre-charge phase. During the pre-charging phase, the voltage level of the DLHOLDL signal is gradually decreased while the data-line voltage at the data line DL_1 is gradually increased.

When the data-line voltage at the data line DL_1 is pre-charged to a certain level (e.g., a voltage level substantially above a threshold voltage of the NOR gate), a clamping function of the clamping circuit 204 is enabled/triggered due to the fact that the control voltage (i.e., DLHOLDL signal) drops to a level that turns off the transistor MN1. Once the transistor MN1 is turned off, the pre-charge path between the supply voltage VDD and the data line DL_1 is cut off. In other words, the pre-charged data-line voltage at the data line DL_1 is clamped at the time the transistor MN1 is turned off.

The clamping circuit 204 is used to clamp the data-line voltage at the data line DL_1 to generate a clamped data-line voltage at the data line DL_1 when the data-line voltage at the data line DL_1 is pre-charged to a certain level that enables the clamping function of the clamping circuit 204. It should be noted that the clamped data-line voltage at the data line DL_1 is lower than the supply voltage VDD of the pre-processing circuit 106. In this way, the clamped data-line voltage at the data line DL_1 has a low voltage swing.

After the data-line voltage at the data line DL_1 is clamped by the transistor MN1, the input voltage $S_{IN}$ to be sensed by the following asymmetrical sense amplifier 108 is developed according to the clamped data-line voltage and a status of the match line/bit line. The control signal msaprecb is set to have the logic high level to turnoff the transistor MP1. As mentioned above, the match line/bit line may be disconnected from the discharge path to have a high-impedance state when a data output of the match line/bit line is "1". Hence, the clamped data-line voltage at the data line DL_1 is held to set the single input (i.e., input voltage $S_{IN}$) of the following asymmetrical sense amplifier 108. In other words, the input voltage $S_{IN}$ developed at the data line DL_1 is substantially equal to the clamped data-line voltage obtained by the clamping circuit 204.

After the input voltage $S_{IN}$ at the data line DL_1 has been well developed, the control signal saeb is set to have the logic low level. In other words, the asymmetrical sense amplifier 108 enters the sensing phase to generate the sensing output out according to the input voltage $S_{IN}$ developed at the data line DL_1. Since the operation of the asymmetrical sense amplifier 108 is detailed above, further description is omitted here for brevity.

As mentioned above, when the data-line voltage at the data line DL_1 is pre-charged to a certain level (e.g., a voltage level substantially above a threshold voltage of the NOR gate), the clamping function of the clamping circuit 204 is enabled. Since the clamped data-line voltage at the data line DL_1 is close to the threshold voltage of the NOR gate, the NOR gate may have direct current (DC) leakage after the pre-charge phase is ended. The DC leakage introduced by the NOR gate may result in undesired power consumption. The present invention therefore proposes using the control signal preca to turn off the NOR gate, such that the feedback control signal (i.e., DLHOLDL signal) is pulled to a lower voltage level (e.g., GND). For example, during the pre-charging of the data line DL_1, the control signal preca is set to have a logic low level; and when the data-line voltage at the data line DL_1 is clamped, the control signal preca is set to have a logic high level. Since the NOR gate is turned off by the control signal preca, the DC leakage of the NOR gate can be effectively reduced after the pre-charge phase is ended. In this way, the undesired DC power consumption resulting from the DC leakage of the NOR gate can be effectively reduced.

Figure 5:
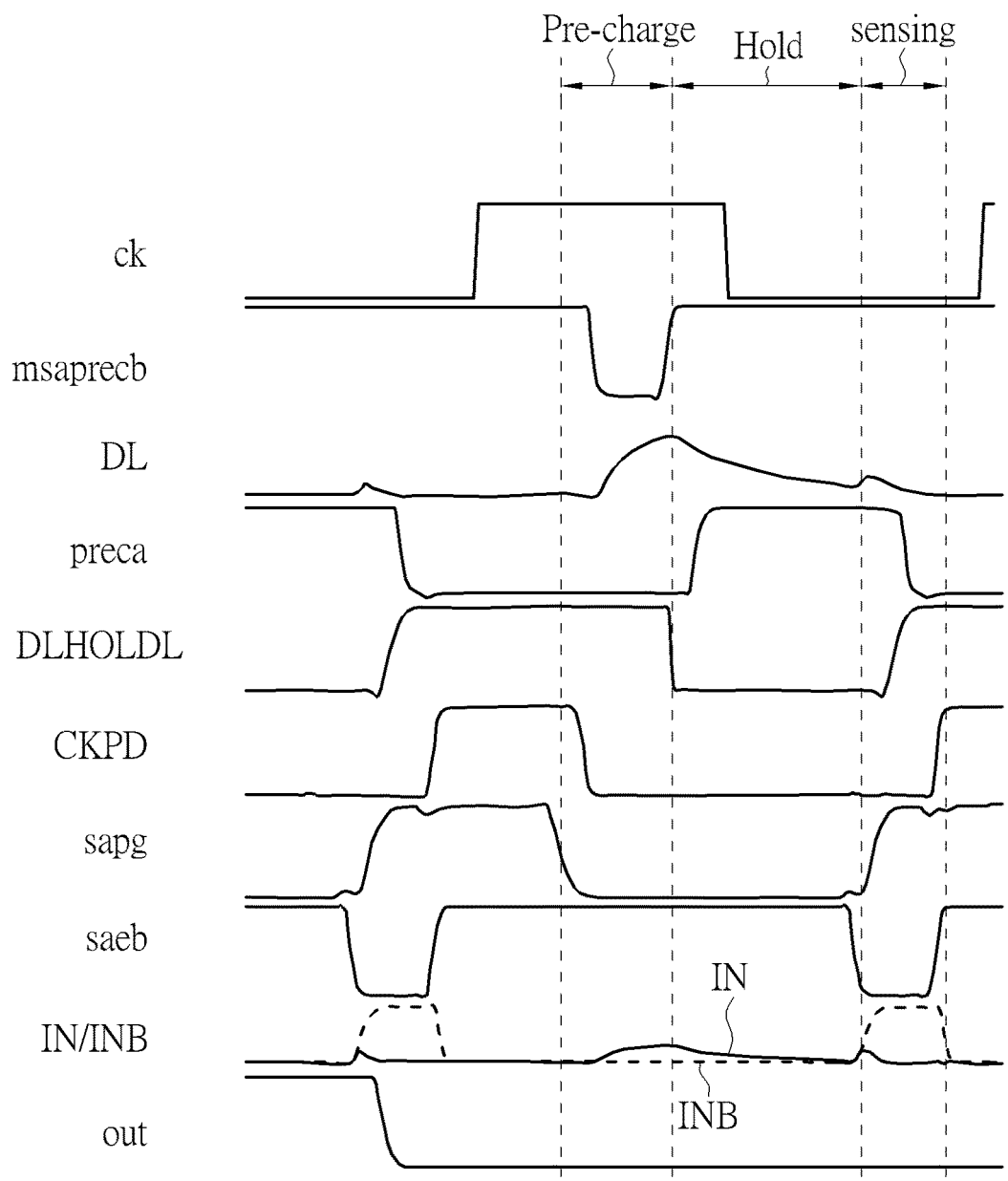
FIG. 5 is a timing diagram illustrating various signals associated with data sensing of a data output "0" according to an embodiment of the present invention.

Please refer to FIG. 2 in conjunction with FIG. 5. FIG. 5 is a timing diagram illustrating of a clock signal (denoted by "ck"), an input voltage (denoted by "$S_{IN}$") at the data line DL_1, control signals (denoted by "msaprecb", "preca", "saeb", "sapg", "CKPD"), voltages at intermediate nodes IN and INB, and a sensing output (denoted by "out") under a condition that the data output is "0". The waveforms of the control signals msaprecb, preca, saeb, sapg, CKPD shown in FIG. 5 are same as that shown in FIG. 4. Further description is omitted here for brevity.

Since a match line/bit line of the memory device 102 is coupled to a discharge path when a data output of the match line/bit line is "0". The discharge path in the memory device 102 is coupled to the pre-charge path established between the supply voltage VDD and the data line DL_1. Hence, the pre-charge current flowing through the pre-charge path is drained by the discharge path in the memory device 102. Compared to the clamped data-line voltage at the data line DL_1 as shown in FIG. 4, the clamped data-line voltage at the data line DL_1 as shown in FIG. 5 has a slightly lower voltage level. In addition, compared to the DLHOLDL signal as shown in FIG. 4, the DLHOLDL signal as shown in FIG. 5 has a slightly higher voltage level at the time the pre-charged data-line voltage at the data line DL_1 is clamped by the transistor MN1 turned off by the control voltage (i.e., DLHOLDL signal).

As mentioned above, the match line/bit line may be connected to the discharge path when a data output of the match line/bit line is "0". Hence, after the clamped data-line voltage at the data line DL_1 is generated by the clamping circuit 204, the clamped data-line voltage is discharged to develop the single input (i.e., input voltage $S_{IN}$) of the following asymmetrical sense amplifier 108. After the input voltage $S_{IN}$ at the data line DL_1 has been well developed, the control signal saeb is set to have the logic low level. In other words, the asymmetrical sense amplifier 108 enters the sensing phase to generate the sensing output out according to the input voltage $S_{IN}$ developed at the data line DL_1. Since the operation of the asymmetrical sense amplifier 108 is detailed above, further description is omitted here for brevity.

In above exemplary circuit design, the feedback circuit of the clamping circuit 204 is implemented using a NOR gate. However, this is for illustrative purposes only, and is not meant to be a limitation of the present invention. In practice, the feedback circuit of the clamping circuit 204 may be implemented using a logic gate arranged to perform a logic operation upon multiple inputs, where the multiple inputs include the data-line voltage at the data line DL_1. For example, the logic gate has a first input node, a second input node and an output node, the first input node is coupled to the data line DL_1, the second node is arranged to receive a control signal (e.g., preca), the output node is coupled to the control node of the transistor MN1, the control signal (e.g., preca) has a first logic level (e.g., logic low level, such) during pre-charging of the data line DL_1, and has a second logic level (e.g., logic high level) when the data-line voltage is clamped. For example, in one alternative design, the feedback circuit of the clamping circuit 204 may be implemented using a NAND gate.

In summary, the pre-processing circuit employs a data-line DC immune clamping scheme. The data-line voltage at the data line is clamped to a certain level which is lower than a supply voltage. Hence, the pre-processing circuit can save power because of low voltage swing, can lower the variation of the data-line voltage because of a clamping function applied to the data line, and can be used in a variety of memory configurations. In addition, the feedback circuit of the pre-processing circuit can be turned off to reduce the DC leakage, thereby cutting down the unnecessary DC power consumption during a period in which the data-line voltage at the data line is clamped. The pre-processing circuit works with a low voltage swing data line, but keeps an enough margin with the asymmetrical sense amplifier 108. Moreover, the sensing circuit can achieve single-ended data sensing needed by a memory device such as a TCAM, a ROM, an 8T 2-Port SRAM, etc.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pre-processing circuit for pre-processing a data-line voltage representative of a data output of a memory device, comprising:

a pre-charging circuit, arranged to pre-charge a data line to adjust the data-line voltage at the data line, wherein the data line is coupled to the memory device; and a clamping circuit, arranged to clamp the data-line voltage to generate a clamped data-line voltage when the data-line voltage is pre-charged to a level that enables a clamping function of the clamping circuit, wherein the clamped data-line voltage is lower than a supply voltage of the pre-processing circuit, and the clamping circuit comprises:

a feedback circuit, arranged to feed back a control voltage according to the data-line voltage at the data line, and further arranged to reduce its direct current (DC) leakage when the data-line voltage is clamped, wherein the clamping function of the clamping circuit is controlled by the control voltage, comprising:

a logic gate arranged to perform a logic operation upon multiple inputs, and the multiple inputs comprise the data-line voltage at the data line, wherein the logic gate has a first input node, a second input node and an output node, the first input node is coupled to the data line, the second node is arranged to receive a control signal, the output node is coupled to the control node of the transistor, the control signal has a first logic level during pre-charging of the data line, and has a second logic level when the data-line voltage is clamped.

2. The pre-processing circuit of claim 1, further comprising:
- a transistor, having a control node, a first connection node and a second connection node, wherein the first connection node is coupled to the pre-charging circuit, the second connection node is coupled to the data line, the data-line voltage is pre-charged when the transistor is turned on, and the pre-charged data-line voltage is clamped when the transistor is turned off;
- wherein the feedback circuit is coupled between the second connection node and the control node of the transistor.

3. The pre-processing circuit of claim 1, wherein the logic gate is a NOR gate or a NAND gate.

4. The pre-processing circuit of claim 1, wherein the memory device is a content-addressable memory (CAM), a read-only memory (ROM), or a statistic random access memory (SRAM).

5. A method for pre-processing a data-line voltage representative of a data output of a memory device, comprising:
- pre-charging a data line to adjust the data-line voltage at the data line, wherein the data line is coupled to the memory device;
- feeding back, by a feedback circuit, a control voltage according to the data-line voltage at the data line, wherein a clamping function is controlled by the control voltage, wherein the feedback circuit comprises a logic gate arranged to perform a logic operation upon multiple inputs, and the multiple inputs comprise the data-line voltage at the data line; and the logic gate has a first input node, a second input node and an output node; the first input node is coupled to the data line, the second node is arranged to receive a control signal, the output node is coupled to the control node of the transistor;
- when the data-line voltage is pre-charged to a level that enables the clamping function, clamping the data-line voltage to generate a clamped data-line voltage, wherein the clamped data-line voltage is lower than a supply voltage;
- setting the control signal by a first logic level during pre-charging of the data line;
- setting the control signal by a second logic level when the data-line voltage is clamped; and
- when the data-line voltage is clamped, controlling the feedback circuit to reduce its direct current (DC) leakage.

6. The method of claim 5, wherein the feedback circuit is coupled between a connection node and a control node of a transistor, the connection node of the transistor is also coupled to the data line, and the method further comprises:
- turning on the transistor to enable the pre-charging step; and
- turning off the transistor to enable the clamping step.

7. The method circuit of claim 5, wherein the logic gate is a NOR gate or a NAND gate.

8. The method of claim 5, wherein the memory device is a content-addressable memory (CAM), a read-only memory (ROM), or a statistic random access memory (SRAM).

9. A sensing circuit for generating a sensing output according to a data-line voltage representative of a data output of a memory device, comprising:
- a pre-processing circuit, arranged to clamp the data-line voltage at a data line to generate a clamped data-line voltage, wherein the data line is coupled to the memory device, and the clamped data-line voltage is lower than a supply voltage of the pre-processing circuit, comprising:
  - a pre-charging circuit, arranged to pre-charge the data line to adjust the data-line voltage; and
  - a clamping circuit, arranged to clamp the data-line voltage when the data-line voltage is pre-charged to a level that enables a clamping function of the clamping circuit, comprising:
    - a transistor, having a control node, a first connection node and a second connection node, wherein the first connection node is coupled to the pre-charging circuit, the second connection node is coupled to the data line, the data-line voltage is pre-charged when the transistor is turned on, and the data-line voltage is clamped when the transistor is turned off; and
    - a feedback circuit, coupled between the second connection node and the control node of the transistor, wherein the feedback circuit is arranged to feed back a control voltage to the control node of the transistor according to the data-line voltage at the data line, and the clamping function of the clamping circuit is controlled by the control voltage, comprising:
      - a logic gate arranged to perform a logic operation upon multiple inputs, wherein the logic gate has a first input node, a second input node and an output node, the first input node is coupled to the data line, the second node is arranged to receive a control signal, the output node is coupled to the control node of the transistor, and the control signal has a first logic level during pre-charging of the data line, and has a second logic level when the data-line voltage is clamped; and
- an asymmetrical sense amplifier, arranged to receive an input voltage developed at the data line after the clamped data-line voltage is generated, and amplify the input voltage to generate the sensing output.

10. The sensing circuit of claim 9, wherein the logic gate is a NOR gate or a NAND gate.

11. The sensing circuit of claim 9, wherein the feedback circuit is further arranged to reduce its direct current (DC) leakage when the data-line voltage is clamped by the transistor.

12. The sensing circuit of claim 9, wherein the memory device is a content-addressable memory (CAM), a read-only memory (ROM), or a statistic random access memory (SRAM).

* * * * *